US006574138B2

(12) United States Patent
Schwarzl et al.

(10) Patent No.: US 6,574,138 B2
(45) Date of Patent: Jun. 3, 2003

(54) MEMORY CELL CONFIGURATION AND METHOD FOR OPERATING THE CONFIGURATION

(75) Inventors: Siegfried Schwarzl, Neubiberg (DE); Stefan Miethaner, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/094,865

(22) Filed: Mar. 6, 2002

(65) Prior Publication Data

US 2002/0154537 A1 Oct. 24, 2002

Related U.S. Application Data

(63) Continuation of application No. PCT/DE00/03017, filed on Sep. 4, 2000.

(30) Foreign Application Priority Data

Sep. 6, 1999 (DE) .......................... 199 42 447

(51) Int. Cl.[7] .............................................. G11C 11/00
(52) U.S. Cl. ...................................... 365/158; 365/171
(58) Field of Search ................................ 365/158, 171, 365/173, 189.01, 157, 97, 145

(56) References Cited

U.S. PATENT DOCUMENTS

| | | | |
|---|---|---|---|
| 5,173,873 A | 12/1992 | Wu et al. ................. | 365/173 |
| 5,640,343 A | 6/1997 | Gallagher et al. | |
| 5,745,406 A | 4/1998 | Yamane et al. | |
| 5,949,707 A * | 9/1999 | Pohm et al. ............. | 365/158 |
| 6,351,408 B1 * | 2/2002 | Schwarzl et al. ........ | 365/145 |
| 6,424,562 B1 * | 7/2002 | Rosner et al. ........... | 365/158 |

FOREIGN PATENT DOCUMENTS

| | | | |
|---|---|---|---|
| EP | 0 936 623 A2 | 8/1999 | |
| EP | WO 00/42614 | * 7/2000 | ............ 365/158 |
| WO | WO 00/42614 | 7/2000 | ............ 365/158 |

OTHER PUBLICATIONS

J.M. Daughton: "Magnetoresistive memory technology", Thin Solid Films, No. 216, 1992, pp. 162–168.
D.D. Tang et al.: "An IC process compatible Nonvolatile Magnetic RAM", IEDM, 1995, pp. 997–999.
Zhigang Wang et al.: "A new type of GMR memory, Journal of Magnetism and Magnetic Materials", No. 155, 1996, pp. 161–163.
S. Mengel: "Technologieanalyse Magnetismus Band 2: XMR–Technologien" [technology analysis magnetism vol. 2: XMR technologies], Verein Deutscher Ingenieure, Technologiezentrum Physikalische Technologien, Aug. 1997, pp. 1–7, and 11–80.

* cited by examiner

*Primary Examiner*—Michael S. Lebentritt
*Assistant Examiner*—Anh Phung
(74) *Attorney, Agent, or Firm*—Laurence A. Greenberg; Werner H. Stemer; Gregory L. Mayback

(57) ABSTRACT

A memory cell configuration has memory cells that each contain two magnetoresistive elements. If the two magnetoresistive elements of each memory cell are magnetized in such a way that they have different resistances, the information stored in the memory cell can be determined with a resistor half-bridge circuit by assessing whether the signal tapped off at the output is greater than or less than zero.

10 Claims, 3 Drawing Sheets

MEMORY CELL CONFIGURATION AND METHOD FOR OPERATING THE CONFIGURATION

CROSS-REFERENCE TO RELATED APPLICATION

This application is a continuation of copending International Application No. PCT/DE00/03017, filed Sep. 4, 2000, which designated the United States.

BACKGROUND OF THE INVENTION

FIELD OF THE INVENTION

With regard to nonvolatile read/write memories, investigations are increasingly be made relating to memory cell configurations in which magnetoresistive elements are used for storing information.

Experts understand that a magnetoresistive element, also called a magnetoresistance element, is a structure that has at least two ferromagnetic layers and a non-magnetic layer arranged in between. Depending on the construction of the layer structure, a distinction is made between a GMR (Giant Magnetoresistance) element, a TMR (Tunneling Magnetoresistance) element and a CMR (Colossal Magnetoresistance) element (see S. Mengel, Technologieanalyse Magnetismus, Band 2, XMR-Technologien [Technology analysis magnetism, volume 2, XMR technologies], published by VDI Technologiezentrum Physikalische Technologien, August 1997).

The term GMR element is used for layer structures that have at least two ferromagnetic layers and a non-magnetic, conductive layer arranged in between and that exhibit the so-called GMR (Giant Magnetoresistance) effect. The GMR effect is understood to refer to the fact that the electrical resistance of a GMR element is dependent on whether the magnetizations in the two ferromagnetic layers are oriented parallel or anti-parallel to one another. The GMR effect is large in comparison with the so-called AMR (Anisotropic Magnetoresistance) effect. The AMR effect is understood to refer to the fact that the resistance in magnetized conductors is different parallel and perpendicular to the magnetization direction. The AMR effect is a bulk effect that occurs in ferromagnetic monolayers.

The term TMR element is used by experts for "Tunneling Magnetoresistance" layer structures that have at least two ferromagnetic layers and an insulating, non-magnetic layer arranged in between. In this case, the insulating layer is so thin that a tunneling current arises between the two ferromagnetic layers. These layer structures likewise exhibit a magnetoresistive effect brought about by a spin-polarized tunneling current through the insulating, non-magnetic layer arranged between the two ferromagnetic layers. In this case, too, the electrical resistance of the TMR element is dependent on whether the magnetizations in the two ferromagnetic layers are oriented parallel or anti-parallel to one another. In this case, the relative change in resistance is about 6 to 40% at room temperature.

It has been proposed (see, for example, D. D. Tang et al. IEDM 95, pages 997 to 999, J. M. Daughton, Thin Solid Films, Vol. 216 (1992), pages 162 to 168, Z. Wang et al, Journal of Magnetism and Magnetic Materials, Vol. 155 (1996), pages 161 to 163) to use GMR elements as memory elements in a memory cell configuration. The memory elements are connected in series using read lines. Word lines run transversely with respect to the read lines and are insulated both from the read lines and from the memory elements. Signals applied to the word lines cause a magnetic field as a result of the current flowing in each word line. This magnetic field, given sufficient strength, influences the magnetizations of the memory elements situated underneath. For writing information, x/y lines are used, which cross at the memory cell to be written to. Signals are applied to the x/y lines, and at the crossover point, these signals cause a magnetic field which is sufficient for the magnetization reversal. In this case, the magnetization direction is reversed in one of the two ferromagnetic layers. By contrast, the magnetization direction in the other of the two ferromagnetic layers remains unchanged. The magnetization direction in the last-mentioned ferromagnetic layer is fixed by using an adjacent antiferromagnetic layer that fixes the magnetization direction, or by increasing the switching threshold of the ferromagnetic layer through different material or different dimensioning, for example, a different layer thickness, in comparison with the first-mentioned ferromagnetic layer. For reading out the information, a pulsed signal is applied to the word line, and this pulsed signal switches the relevant memory cell back and forth between the two magnetization states. The current through the bit line is measured, from which the resistance of the corresponding memory element is determined.

U.S. Pat. No. 5,173,873 discloses a magnetoresistive memory cell configuration in which transistors are provided for selecting the memory cells that will be read.

U.S. Pat. No. 5,640,343 discloses a memory cell configuration in which TMR elements that are connected in series with a diode are used as memory elements. The diode serves for reading out the information of the individual memory cells.

SUMMARY OF THE INVENTION

It is accordingly an object of the invention to provide a memory cell configuration having magnetoresistive elements and a method for operating the memory cell configuration which overcome the above-mentioned disadvantages of the prior art apparatus and methods of this general type.

In particular, it is an object of the invention to provide a memory cell configuration having magnetoresistive elements in which the stored information can be reliable read-out.

It is also an object of the invention to construct the memory cell configuration with a high packing density and with a low outlay on process engineering.

With the foregoing and other objects in view there is provided, in accordance with the invention, a memory cell configuration that includes: a signal line; and memory cells. Each one of the memory cells has two magnetoresistive elements. The two magnetoresistive elements of each one of the memory cells are magnetized to have different resistances. The signal line connects the two magnetoresistive elements of one of the memory cells in series to form an overall resistor with two ends. One of the two ends of the overall resistor is connected to a first voltage having a magnitude and a polarity. Another one of the two ends of the overall resistor is connected to a second voltage having a magnitude equal to the magnitude of the first voltage and a polarity opposite the polarity of the first voltage.

In accordance with an added feature of the invention, each one of the two magnetoresistive elements of each one of the memory cells is either a Giant Magnetoresistance element or a Tunneling Magnetoresistance element.

In accordance with an additional feature of the invention, the two magnetoresistive elements of one of the memory cells are configured adjacent to one another in a plane.

In accordance with another feature of the invention, there is provided a plurality of first lines running parallel to each other; and a plurality of second lines running parallel to each other. The plurality of the first lines and the plurality of the second lines cross each another. The two magnetoresistive elements of each one of the memory cells are connected between one of the plurality of the first lines and one of the plurality of the second lines. The two magnetoresistive elements of one of the memory cells are connected to different ones of the plurality of the first lines and to the same one of the plurality of the second lines.

In accordance with a further feature of the invention, each one of the two magnetoresistive elements of each one of the memory cells includes at least a first ferromagnetic layer element, a nonmagnetic layer element, and a second ferromagnetic layer element. The nonmagnetic layer element is configured between the first ferromagnetic layer element and the second ferromagnetic layer element. In each one of the memory cells, the first ferromagnetic layer element and the second ferromagnetic layer element of a first one of the two magnetoresistive elements have magnetizations that are oriented parallel to each other. In each one of the memory cells, the first ferromagnetic layer element and the second ferromagnetic layer element of a second one of the two magnetoresistive elements have magnetizations that are oriented anti-parallel to each other.

In accordance with a further added feature of the invention, the first ferromagnetic layer element and the second ferromagnetic layer element of each one of the two magnetoresistive elements of each one of the memory cells includes at least one of the following elements: Fe, Ni, Co, Cr, Mn, Bi, Gd and Dy. The first ferromagnetic layer element of each one of the two magnetoresistive elements of each one of the memory cells has a thickness between 2 nm and 20 nm perpendicular to the layer plane. The second ferromagnetic layer element of each one of the two magnetoresistive elements of each one of the memory cells has a thickness between 2 nm and 20 nm perpendicular to the layer plane. The nonmagnetic layer element of each one of the two magnetoresistive elements of each one of the memory cells includes at least one of the following materials: $Al_2O_3$, NiO, $HfO_2$, $TiO_2$, NbO, $SiO_2$, Cu, Au, Ag and Al. The nonmagnetic layer element of each one of the two magnetoresistive elements of each one of the memory cells has a thickness between 1 nm and 5 nm.

In accordance with a further additional feature of the invention, there is provided, a plurality of lines; and a plurality of current followers. Each one of the plurality of the current followers is connected to a respective one of the plurality of the lines.

In accordance with yet an added feature of the invention, there is provided, a plurality of first lines running parallel to each other; a plurality of second lines running parallel to each other; and a plurality of current followers. Each one of the plurality of the current followers is connected to a respective one of the plurality of the second lines. The plurality of the first lines and the plurality of the second lines cross each another. The two magnetoresistive elements of each one of the memory cells are connected between one of the plurality of the first lines and one of the plurality of the second lines. The two magnetoresistive elements of one of the memory cells is connected to different ones of the plurality of the first lines and to a given one of the plurality of the second lines.

With the foregoing and other objects in view there is also provided, in accordance with the invention, a method for operating a memory cell configuration, which includes a step of: providing a memory cell configuration that includes: a signal line; and memory cells; each one of the memory cells having two magnetoresistive elements; in each one of the memory cells, the two magnetoresistive elements are magnetized to have different resistances; the signal line connecting the two magnetoresistive elements of one of the memory cells in series to form an overall resistor with two ends; one of the two ends of the overall resistor being connected to a first voltage having a magnitude and a polarity; and another one of the two ends of the overall resistor being connected to a second voltage having a magnitude equal to the magnitude of the first voltage and a polarity opposite the polarity of the first voltage. The method also includes steps of: reading out information from the one of the memory cells by assessing whether a voltage drop on the signal line is greater than or less than zero; and changing the information stored in the one of the memory cells by changing the resistances of both of the magnetoresistive elements of the one of the memory cells.

The memory cell configuration has memory cells, each memory cell containing two magnetoresistive elements. TMR elements or GMR elements are preferably used as magnetoresistive elements since they exhibit sufficiently large changes in resistance in the event of magnetization reversal at room temperature, and at the same time, can be subjected to magnetization reversal with tenable magnetic fields.

This memory cell configuration makes it possible to store data using multi-level logic, that is to say, in a memory cell, four different states are possible with regard to the resistances of the magnetoresistive elements. These states can be assigned to four different logic values. An increased memory density and hence packing density can thereby be achieved.

As an alternative, the magnetoresistive elements in each memory cell can be magnetized in such a way that they always have different resistances. In this case, two different states are possible per memory cell, which states can be assigned to two logic values. This configuration of the memory cell configuration can be read with a reduced outlay on circuitry, so that the memory cell configuration can be produced with a reduced space requirement. In addition, this configuration enables higher security during read-out.

In order to read from this memory cell configuration, the magnetoresistive elements of a memory cell are preferably in each case connected between a voltage level and a signal line, the voltage level having the same magnitude for both magnetoresistive elements, but having a different polarity. The signal line is the same for both magnetoresistive elements. It is assessed, whether the voltage drop on the signal line is greater than or less than zero. Consequently, a simple bridge circuit is sufficient for reading out the information.

In this case, it is advantageous to arrange the magnetoresistive elements of a memory cell adjacent to one another. In this way, technologically governed property inhomogeneities of the magnetoresistive elements that are based on systematic process inhomogeneities, in particular during the deposition, lithography, etching, etc. will have no influence on the assessment signal. Furthermore, the external circuitry required for the bridge circuit is symmetrical.

The memory cell configuration can be assessed both by switching read-out and by non-switching read-out. Non-switching read-out, which is faster and simpler to realize than switching read-out, is understood to be the fact that the currents in the interconnect grid are subcritical during the read-out operation, that is to say, the switching thresholds for the magnetization reversal of the memory elements are not reached. The memory cell states remain unchanged, with the result that the original memory information does not have to be read in again in a time-consuming manner after the read-out.

In this memory cell configuration, the different logic states that are assigned to zero and one are identified by the different sign of the read signal. Signals with different signs can easily be distinguished by circuitry. Therefore, the memory cell configuration can be read with high assessment security.

With regard to a large-area memory cell configuration, it is advantageous to provide first and second lines. In this case, the first lines run parallel to one another and the second lines run parallel to one another. The first lines cross the second lines. The magnetoresistive elements are in each case connected between one of the first lines and one of the second lines. In this case, the magnetoresistive elements of one of the memory cells are in each case connected to two different first lines and the same second line. In order to read out the information stored in the memory cell, voltage levels which have the same magnitude but opposite polarity are applied to the two first lines, and the remaining first lines are connected to reference potential, in particular ground. On the second line, which is connected to the magnetoresistive elements of the selected memory cell, the signal is assessed. The voltage signal generated on the second line has a different polarity depending on the stored information. The signal level is dependent on the magnetoresistance values of the magnetoresistive elements, on the voltage levels applied to the first lines, and on the number of first lines present. As the number of first lines increases, the level of the signal decreases.

In order to compensate for the influence of the number of first lines on the signal level, it is advantageous to connect the second lines to a current follower. The current follower has a feedback operational amplifier whose inverting input is connected to the respective second line. The non-inverting input is connected to ground potential. As a result, the potential on the second line is regulated to zero. At the output of the operational amplifier, a signal is present from which the polarity of the output signal of the memory cell configuration can be read.

Preferably, the magnetoresistive elements each have at least a first ferromagnetic layer element, a nonmagnetic layer element, and a second ferromagnetic layer element. The nonmagnetic layer element is arranged between the first ferromagnetic layer element and the second ferromagnetic layer element. For each memory cell, the magnetizations in the first ferromagnetic layer element and the second ferromagnetic layer element are oriented parallel to one another in one of the magnetoresistive elements and the magnetizations in the first ferromagnetic layer element and the second ferromagnetic layer element are oriented antiparallel to one another in the other of the magnetoresistive elements.

It lies within the scope of the invention for the first ferromagnetic layer element and the second ferromagnetic layer element to contain at least one of the materials Fe, Ni, Co, Cr, Mn, Bi, Gd and/or Dy, and for them to have in each case a thickness of between 2 and 20 nm perpendicular to the layer plane.

It lies within the scope of the invention for the nonmagnetic layer element to contain $Al_2O_3$, NiO, $HfO_2$, $TiO_2$, NbO, $SiO_2$, Cu, Au, Ag and/or Al, and to have a thickness of between 1 nm and 5 nm perpendicular to the layer plane.

Other features which are considered as characteristic for the invention are set forth in the appended claims.

Although the invention is illustrated and described herein as embodied in a memory cell configuration and method for operating the configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
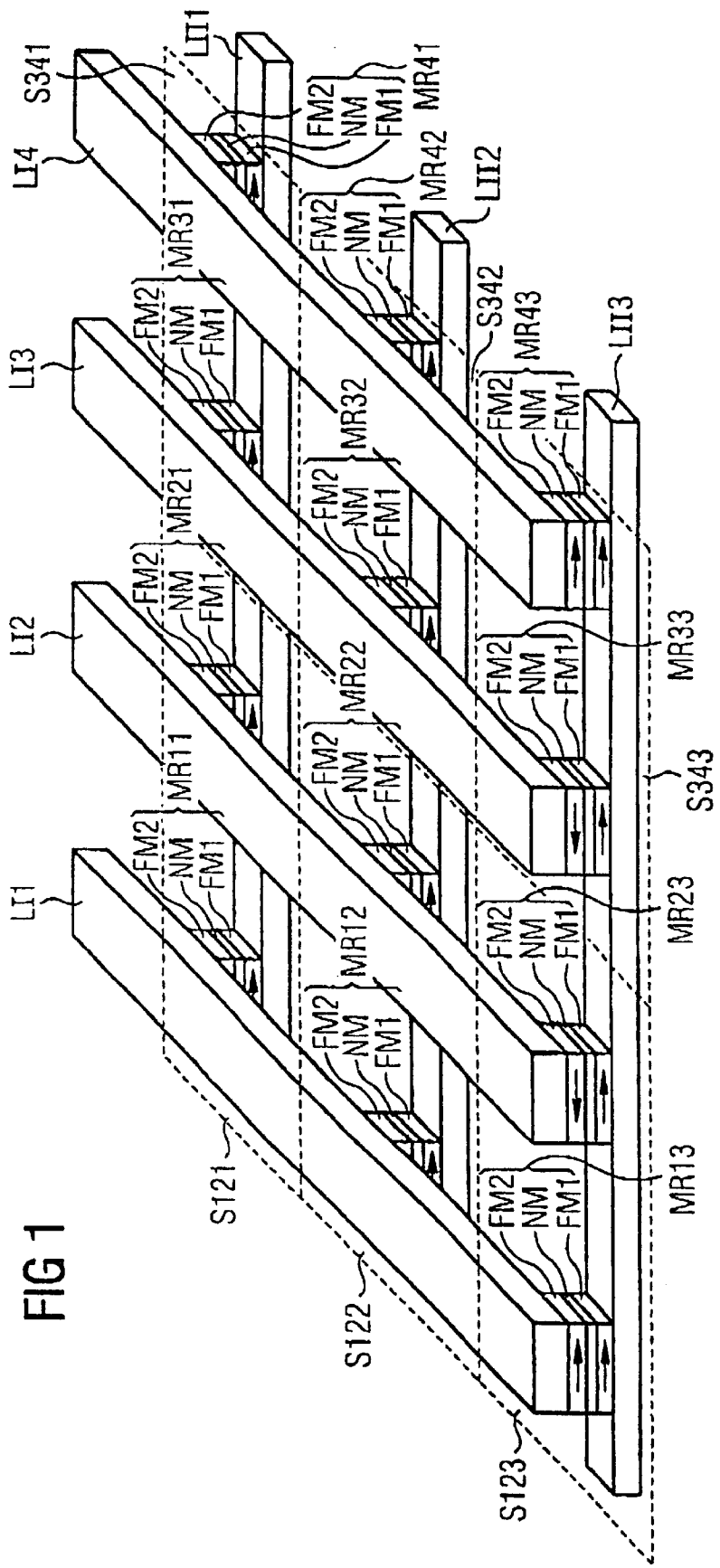
FIG. 1 is a view of a memory cell configuration having memory cells that each have two magnetoresistive elements.

Referring now to the figures of the drawing in detail and first, particularly, to FIG. 1 thereof, there is shown a memory cell configuration including strip-type first lines $LI_i$, $i=1 \ldots m$, which run parallel among one another. Furthermore, the memory cell configuration includes second lines $LII_j$, $j=1 \ldots n$. The second lines $LII_j$ are likewise in strip form and run parallel among one another. The first lines $LI_i$ and the second lines $LII_j$ cross one another.

At the crossover points between one of the first lines $LI_i$ and one of the second lines $LII_j$, a magnetoresistive element $MR_{ij}$ is in each case arranged and connected between the relevant lines. Each of the magnetoresistive elements $MR_{ij}$ includes a first ferromagnetic layer element FM1, a non-magnetic layer element NM and a second ferromagnetic layer element FM2. The first ferromagnetic layer element FM1 includes CoFe and has a thickness of 2 to 10 nm. The magnetization of this layer element can be fixed in a specific direction by using an underlying anti-ferromagnetic layer made, for example, of FeMn or InMn. The non-magnetic layer element NM contains $Al_2O_3$ and has a thickness of 0.5 to 3 nm. The second ferromagnetic layer element FM2 contains NiFe and has a layer thickness of 2 to 8 nm. In this exemplary embodiment, the first ferromagnetic layer element FM1, because of its material composition, has a greater magnetic hardness than the second ferromagnetic layer element FM2.

Each two adjacent magnetoresistive elements $MR_{ij}$, $MR_{i+1j}$ that are connected to different first lines $LI_i$, $LI_{i+1}$ form a memory cell $S_{ii+1j}$. The memory cells $S_{ii+1j}$ are marked by broken lines in FIG. 1. In this case, the two magnetoresistive elements $MR_{ij}$, $MR_{i+1j}$ of a memory cell $S_{ii+1j}$ are connected to the same second line $LII_j$.

The magnetizations of the ferromagnetic layer elements FM1, FM2 in the magnetoresistive elements $MR_{ij}$, $MR_{i+1j}$ of one and the same memory cell $S_{ii+1j}$ are oriented in such a way that the magnetization directions in the first ferromagnetic element FM1 and the second ferromagnetic element FM2 are oriented parallel to one another in one of the magnetoresistive elements MRij, MRi+1j and anti-parallel to one another in the other magnetoresistive element. Moreover, the magnetizations in the first ferromagnetic elements FM1 are oriented uniformly in one direction (parallel to the lines LIIj in FIG. 1). As a result, the magnetoresistive elements MRij, MRi+1j of one and the same memory cell Sii+1j have different resistances. A digital information item with two logic values is stored in the memory cells Sii+1j by using the configuration of the different resistances, in other words by the fact that the magnetoresistive element MRij has the smaller resistance and the magnetoresistive element MRi+1j has the larger resistance, or by the fact that the magnetoresistive element MRij has the larger resistance and the magnetoresistive element MRi+1j the smaller resistance.

The magnetizations in the first and second ferromagnetic elements (FM1 and FM2, respectively) can all be directed parallel to the first lines LIi or parallel to the second lines LIIj, as illustrated in FIG. 1.

Figure 2:
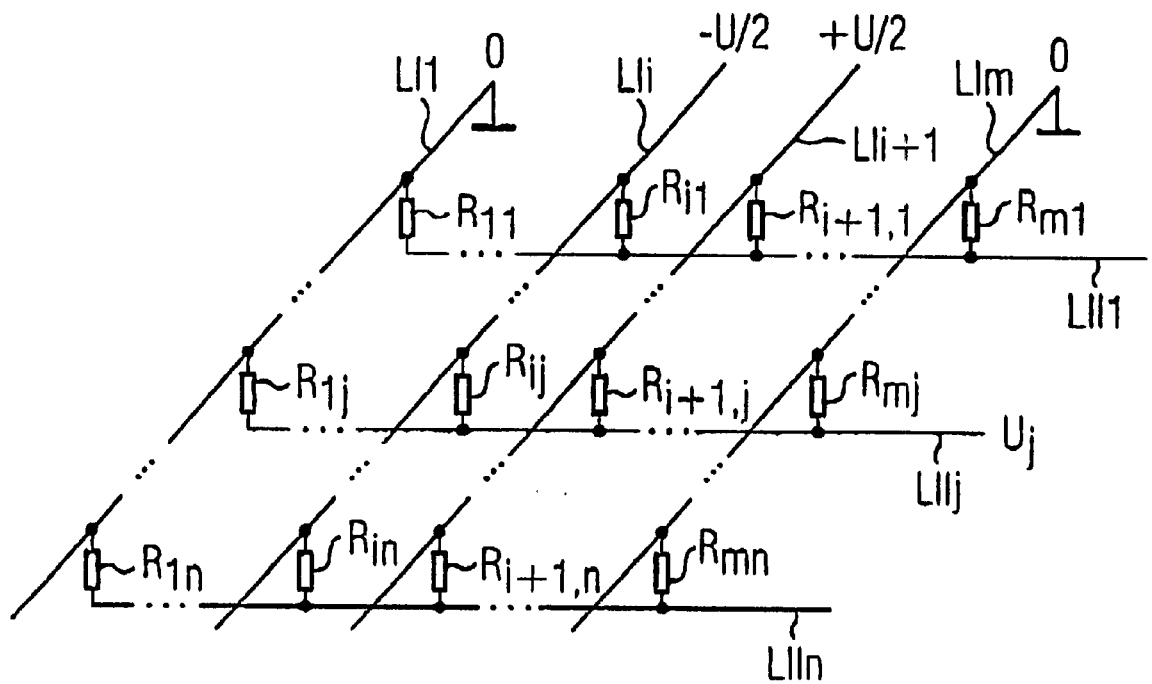
FIG. 2 is a schematic sketch of an inventive memory cell configuration, which is used to explain the process of reading information from a cell.

The memory cell configuration constitutes a resistance matrix. FIG. 2 illustrates a schematic sketch of this resistance matrix, in which the magnetoresistive elements MRij are identified by their resistance $R_{ij}$.

In order to read from a memory cell Sii+1j with the resistances $R_{ij}$ and $R_{i+1j}$, voltage levels other than zero are applied to the associated first lines LIi, LIi+1. In this case, $-U/2$ is applied to the first line LIi and $+U/2$ is applied to the first line LIi+1. The remaining first lines LIx, where $x \neq i, i+1$, are connected to ground potential (potential 0). On the second line LIIj, which is connected to the resistances $R_{ij}$ and $R_{i+1j}$ of the memory cell Sii+1j, an output signal is assessed. The center contact of the voltage source which supplies the voltage $-U/2$ and $+U/2$ is likewise at ground potential.

The level Uj of the signal tapped off on the second line LIIj can be estimated as follows: The resistances Rxj, where $x \neq i, i+1$, which are connected, one the one hand, to ground potential via the first lines LIx, where $x \neq i, i+1$, and, on the other hand, to the second line LIIj, together form the shunt resistance Rj of a half-bridge formed by Rij and Ri+1,j.

Figure 3:
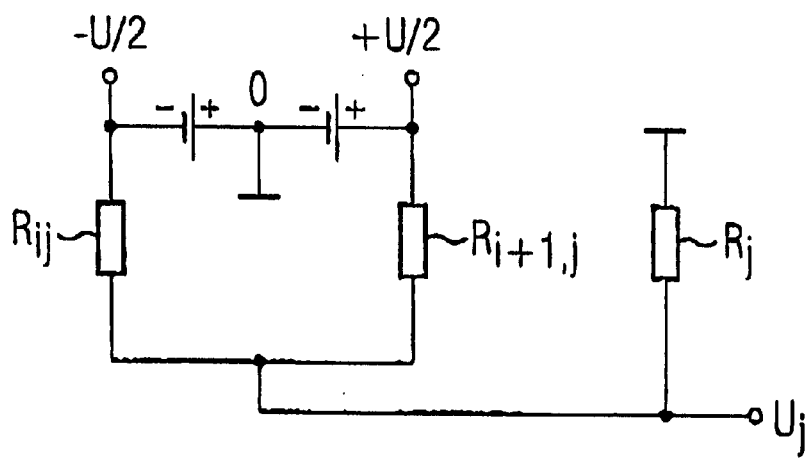
FIG. 3 shows an equivalent circuit diagram of a memory cell that will be read.

FIG. 3 shows an equivalent circuit diagram of the memory cell Sii+1j that will be read from.

The following holds true for the resistance $R_j$:

$$R_0/(m-2) \leq R_j \leq (R_0 + \Delta R)/(m-2)$$

In this case, $R_0$ is the smaller and $R_0 + \Delta R$ the larger of the two resistances which the magnetoresistive elements MRij can assume. The lower value for $R_j$ applies to the case where all the resistances assume the value $R_o$. The upper limit applies to the case where all the resistances assume $R_o + \Delta R$. The following holds true for the magnitude $U_{jo}$ of the level $U_j$ of the signal on the second line LIIj:

$$\frac{U}{2} \frac{\Delta R/R_0}{\Delta R/R_0(m-1)+m} < U_{jo} < \frac{U}{2} \frac{\Delta R/R_0}{\Delta R/R_0 + m}.$$

Depending on the stored logic information, the level $U_j$ of the signal can assume the values $+U_{jo}$ or $-U_{jo}$.

$$U_j = \begin{cases} +U_{jo} \\ -U_{jo} \end{cases}$$

Therefore, in order to read out the information, it is sufficient to determine whether the level is greater than or less than zero on the second line LIIj. This assessment is preferably effected using a bistable circuit, for example, a Schmitt trigger or a high-gain differential amplifier. The level of the magnitude $U_{jo}$ is inversely proportional to the number m of first lines LIi. As the number m of first lines LIi increases, the signal level therefore decreases.

Figure 4:
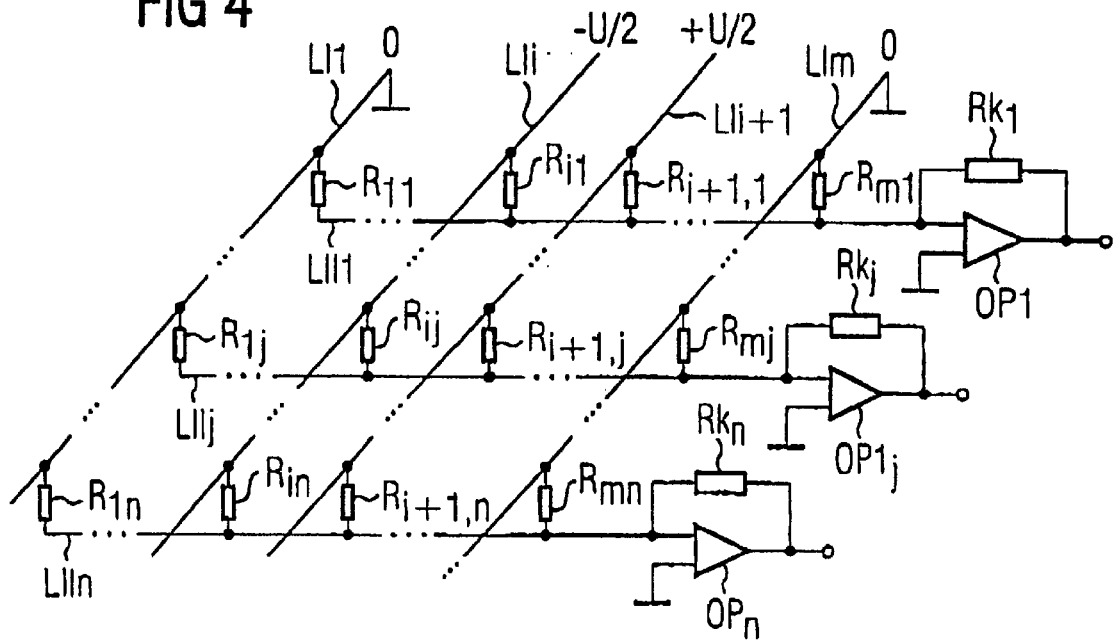
FIG. 4 shows alternative circuitry for reading-out from the memory cell configuration.

FIG. 4 illustrates a schematic sketch of the resistance matrix, in which the magnetoresistive elements MRij are identified by their resistance $R_{ij}$, and in which additional circuitry has been provided for reading out from the memory cells. For reliably assessing the signal $U_j$ independently of the number of first lines LIi, the second lines LIIj are in each case connected to the inverting input of an operational amplifier $OP_j$ having feedback via the resistor $R_{kj}$. The non-inverting input of the operational amplifier $OP_j$ is connected to ground. A signal $U_j'$ is tapped off at the output of this operational amplifier $OP_j$, which is connected up as a current follower. The signal level $U_{jo}'$ of this signal is independent of the number of first lines LIm. The following holds true for the magnitude $U_{jo}'$.

$$U_{jii} = \frac{Rk_j}{R_0} \frac{U}{2} \frac{\Delta R/R_0}{\Delta R/R_0 + 1}$$

The signal $U_j'$ can again assume the value $+U_{jo'}$ or $-U_{jo'}$ depending on what logic information is stored in the memory cell Sii+1j.

$$U_j' = \begin{cases} +U_{jo'} \\ -U_{jo'} \end{cases}$$

Figure 5:
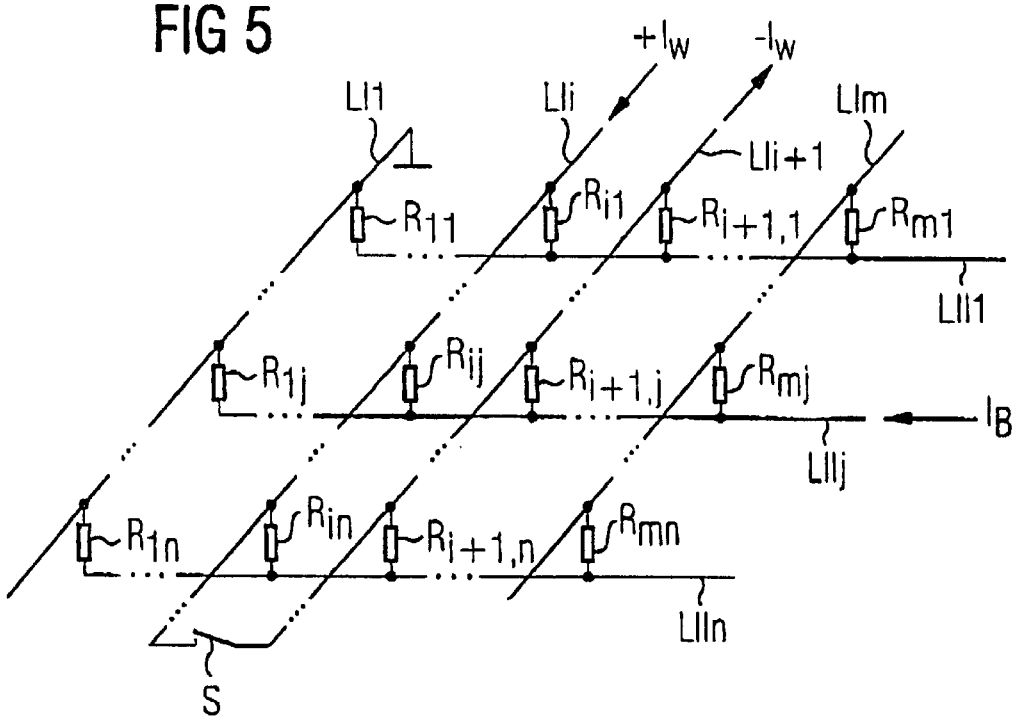
FIG. 5 shows a schematic sketch of the inventive memory cell configuration, which is used to explain the process of writing information to a cell.

FIG. 5 is a sketch of the resistance matrix, which is used to illustrate a writing operation. For writing information, a positive current $+I_W$ is applied to the first line LIi and a negative current $-I_W$ is applied to the first line LIi+1. These currents have an identical magnitude. These currents can flow from a common current source, if the first lines LIi, LIi+1 are connected to one another via a switch S. A current $I_B$ is applied to the associated second line LIIj. At the crossover points between the first lines LIi, LIi+1 and the second line LIIj, at which the magnetoresistive elements MRij, MRi+1j with the resistances $R_{ij}$, $R_{i+1,j}$ are arranged, the currents $I_B$ and $I_W$ bring about a sufficiently large magnetic field to switch the magnetizations in the second ferromagnetic layer elements FM2.

In this case, the magnetizations in the first ferromagnetic layer elements FM1, which are magnetically harder because of their material selection, remain unchanged (see FIG. 5). For writing, the currents $I_W$ and $I_B$ should be chosen in such a way that the resulting magnetic fields exceed the switching thresholds of the second ferromagnetic layer elements FM2 at the location of the resistances Rij, $R_{i+1,j}$. The information that is written is defined by the direction of the current $I_W$. The second lines LIIj act as signal lines.

The first lines LIi may in each case be used as word lines, and the second lines LIIj may be used as bit lines. As an alternative, it is possible to use the first lines LIi as bit lines and the second lines LIIj as word lines.

We claim:

1. A memory cell configuration, comprising:
   a signal line; and
   memory cells;
   each one of said memory cells having two magnetoresistive elements;
   in each one of said memory cells, said two magnetoresistive elements are magnetized to have different resistances;
   said signal line connecting said two magnetoresistive elements of one of said memory cells in series to form an overall resistor with two ends;
   one of said two ends of said overall resistor being connected to a first voltage having a magnitude and a polarity; and
   another one of said two ends of said overall resistor being connected to a second voltage having a magnitude equal to the magnitude of said first voltage and a polarity opposite the polarity of the first voltage.

2. The memory cell configuration according to claim 1, wherein each one of said two magnetoresistive elements of each one of said memory cells is selected from the group consisting of a Giant Magnetoresistance element and a Tunneling Magnetoresistance element.

3. The memory cell configuration according to claim 2, wherein said two magnetoresistive elements of one of said memory cells are configured adjacent to one another in a plane.

4. The memory cell configuration according to claim 1, wherein said two magnetoresistive elements of one of said memory cells are configured adjacent to one another in a plane.

5. The memory cell configuration according to claim 1, comprising:
   a plurality of first lines running parallel to each other; and
   a plurality of second lines running parallel to each other;
   said plurality of said first lines and said plurality of said second lines crossing each another;
   said two magnetoresistive elements of each one of said memory cells being connected between one of said plurality of said first lines and one of said plurality of said second lines; and
   said two magnetoresistive elements of one of said memory cells being connected to different ones of said plurality of said first lines and to a same one of said plurality of said second lines.

6. The memory cell configuration according to claim 1, wherein:
   each one of said two magnetoresistive elements of each one of said memory cells includes at least a first ferromagnetic layer element, a nonmagnetic layer element, and a second ferromagnetic layer element, said nonmagnetic layer element is configured between said first ferromagnetic layer element and said second ferromagnetic layer element;
   in each one of said memory cells, said first ferromagnetic layer element and said second ferromagnetic layer element of a first one of said two magnetoresistive elements have magnetizations that are oriented parallel to each other; and
   in each one of said memory cells, said first ferromagnetic layer element and said second ferromagnetic layer element of a second one of said two magnetoresistive elements have magnetizations that are oriented antiparallel to each other.

7. The memory cell configuration according to claim 6, wherein:
   said first ferromagnetic layer element and said second ferromagnetic layer element of each one of said two magnetoresistive elements of each one of said memory cells includes at least one element selected from the group consisting of Fe, Ni, Co, Cr, Mn, Bi, Gd and Dy;
   said first ferromagnetic layer element and said second ferromagnetic layer element of each one of said two magnetoresistive elements of each one of said memory cells lie in layer planes;
   said first ferromagnetic layer element of each one of said two magnetoresistive elements of each one of said memory cells has a thickness between 2 nm and 20 nm perpendicular to the layer planes;
   said second ferromagnetic layer element of each one of said two magnetoresistive elements of each one of said memory cells has a thickness between 2 nm and 20 nm perpendicular to the layer planes;
   said nonmagnetic layer element of each one of said two magnetoresistive elements of each one of said memory cells includes a material selected from the group consisting of $Al_2O_3$, NiO, $HfO_2$, $TiO_2$, NbO, $SiO_2$, Cu, Au, Ag and Al; and said nonmagnetic layer element of each one of said two magnetoresistive elements of each one of said memory cells has a thickness between 1 nm and 5 nm.

8. The memory cell configuration according to claim 1, comprising:
   a plurality of lines; and
   a plurality of current followers;
   each one of said plurality of said current followers connected to a respective one of said plurality of said lines.

9. The memory cell configuration according to claim 1, comprising:
   a plurality of first lines running parallel to each other;
   a plurality of second lines running parallel to each other; and
   a plurality of current followers;
   each one of said plurality of said current followers connected to a respective one of said plurality of said second lines;
   said plurality of said first lines and said plurality of said second lines crossing each another;
   said two magnetoresistive elements of each one of said memory cells being connected between one of said plurality of said first lines and one of said plurality of said second lines; and
   said two magnetoresistive elements of one of said memory cells being connected to different ones of said plurality of said first lines and to a given one of said plurality of said second lines.

10. A method for operating a memory cell configuration, which comprises:
    providing a memory cell configuration that includes:
       a signal line; and
       memory cells;
       each one of the memory cells having two magnetoresistive elements;
       in each one of the memory cells, the two magnetoresistive elements are magnetized to have different resistances;
       the signal line connecting the two magnetoresistive elements of one of the memory cells in series to form an overall resistor with two ends;

one of the two ends of the overall resistor being connected to a first voltage having a magnitude and a polarity; and another one of the two ends of the overall resistor being connected to a second voltage having a magnitude equal to the magnitude of the first voltage and a polarity opposite the polarity of the first voltage;

reading out information from the one of the memory cells by assessing whether a voltage drop on the signal line is greater than or less than zero; and by assessing whether a voltage drop on the signal line is greater than or less than zero; and changing the information stored in the one of the memory cells by changing the resistances of both of the magnetoresistive elements of the one of the memory cells.

* * * * *